(12) United States Patent
Krishnan et al.

(10) Patent No.: US 9,373,524 B2
(45) Date of Patent: Jun. 21, 2016

(54) DIE LEVEL CHEMICAL MECHANICAL POLISHING

(71) Applicant: International Business Machines Corporation, Armonk, NY (US)

(72) Inventors: Rishikesh Krishnan, Painted Post, NY (US); Rajasekhar Venigalla, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/259,657

(22) Filed: Apr. 23, 2014

(65) Prior Publication Data

US 2015/0311088 A1     Oct. 29, 2015

(51) Int. Cl.
| H01L 21/302 | (2006.01) |
| H01L 21/321 | (2006.01) |
| B24B 37/04 | (2012.01) |
| B24B 37/20 | (2012.01) |
| H01L 21/3105 | (2006.01) |

(52) U.S. Cl.
CPC ............ *H01L 21/3212* (2013.01); *B24B 37/04* (2013.01); *B24B 37/20* (2013.01); *H01L 21/31053* (2013.01)

(58) Field of Classification Search
CPC ...... B24B 37/04; B24B 49/105; B24B 49/00; B24B 21/04; B24B 27/105
USPC ............. 451/6, 8, 41, 159, 357; 438/689–692
See application file for complete search history.

(56) References Cited

U.S. PATENT DOCUMENTS

| 4,606,151 | A | 8/1986 | Heynacher |
| 5,928,960 | A | 7/1999 | Greco et al. |
| 6,020,262 | A | 2/2000 | Wise et al. |
| 6,135,865 | A | 10/2000 | Beardsley et al. |
| 6,769,961 | B1 | 8/2004 | Kistler et al. |
| 7,510,463 | B2 | 3/2009 | Kim et al. |
| 7,846,008 | B2 * | 12/2010 | Bajaj ....................... B24B 37/26 451/527 |
| 7,980,922 | B2 | 7/2011 | Kiesel et al. |
| 8,565,510 | B2 | 10/2013 | Cohn et al. |
| 2002/0072308 | A1 * | 6/2002 | Kane ........................ B24B 49/16 451/41 |
| 2005/0221736 | A1 | 10/2005 | Hsin et al. |
| 2006/0035564 | A1 | 2/2006 | Novak et al. |
| 2009/0298388 | A1 * | 12/2009 | Li ........................... B24B 21/04 451/6 |
| 2010/0035516 | A1 | 2/2010 | Takahashi et al. |
| 2011/0021115 | A1 | 1/2011 | Oh et al. |
| 2015/0311088 | A1 | 10/2015 | Krishnan et al. |

OTHER PUBLICATIONS

Office Action dated Dec. 9, 2015, issued in U.S. Appl. No. 14/839,358.

\* cited by examiner

*Primary Examiner* — Duy Deo
*Assistant Examiner* — Maki Angadi
(74) *Attorney, Agent, or Firm* — Scully, Scott, Murphy & Presser, P.C.; Steven J. Meyers (57) ABSTRACT

A method of polishing a wafer at the die level with a targeted slurry delivery system. The wafer is placed on a wafer carrier exposing the top side of the wafer, the wafer contains a die. The polishing apparatus will polish a portion of the die using a pad that is smaller than the die and the pad is located above the die. A slurry is applied to a portion of the die being polished. Embodiments of the invention provide multiple pads working on the same die.

19 Claims, 7 Drawing Sheets

DIE LEVEL CHEMICAL MECHANICAL POLISHING

BACKGROUND

The present invention generally relates to semiconductor device manufacturing, and particularly to polishing an individual die within a semiconductor wafer.

Rapid progress in semiconductor device integration demands smaller wiring patterns or interconnections connecting active areas. As a result, the tolerances regarding the planarity or flatness of the semiconductor wafers are also becoming smaller. One way of flattening the surface of a semiconductor wafers is to polish the wafer.

In general, a semiconductor wafer can be polished to provide a planarized surface to remove surface variations or defects. A polishing process often used is a chemical mechanical polishing ("CMP") and may be utilized to improve the quality and reliability of semiconductor devices. The CMP process may be performed during the formation of various devices and integrated circuits on the wafer.

The CMP process involves holding a thin flat wafer of semiconductor material against a rotating polishing pad under a controlled downward pressure and the wafer is above the polishing pad. A polishing slurry such as a solution of alumina or silica may be utilized as an abrasive medium. A rotating polishing head or wafer carrier is typically utilized to hold the wafer under controlled pressure against a rotating polishing pad. The polishing pad is typically covered with a relatively soft wetted pad material such as blown polyurethane.

SUMMARY

According to one embodiment of the present invention, a method may include placing a wafer on a wafer carrier, where a front side of the wafer is exposed and the back side of the wafer is held by the wafer carrier. The wafer contains a single die or multiple dies with varying topography. The die is polished by a polishing pad which is smaller than, and above, the die; where the bottom of the pad is the polishing surface and a slurry delivery system applies slurry to the portion of the die being polished.

According to another embodiment of the present invention, an apparatus for polishing a wafer at the die level is provided. The apparatus may include a wafer carrier that is configured to harness a back side of a wafer such that a front side of the wafer is exposed. A pad, a pad carrier, and a polishing carrier are above the wafer carrier. The pad carrier is located above the pad and connected to the pad; and the polishing carrier is above the pad carrier and connected to the pad carrier. The apparatus may include a slurry delivery system located below the polishing carrier, connected to the polishing carrier, and above the wafer carrier.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and particularly to polishing an individual die within a semiconductor wafer and applying slurry to the portion of the die being polished.

Ideally, it may be desirable to have improved uniformity across the surface of the wafer, and more particularly, across each individual die surface. One way to improve die surface uniformity is to polish a particular die region within a die, independent of other die regions. Polishing a particular die region may be done to create uniformity on the die surface or to create desired variations on the die surface. One embodiment by which to polish a particular die region is described in detail below by referring to the accompanying drawings FIGS. 1-5. In a preferred embodiment, the polishing pad may be smaller than the die.

Figure 1:
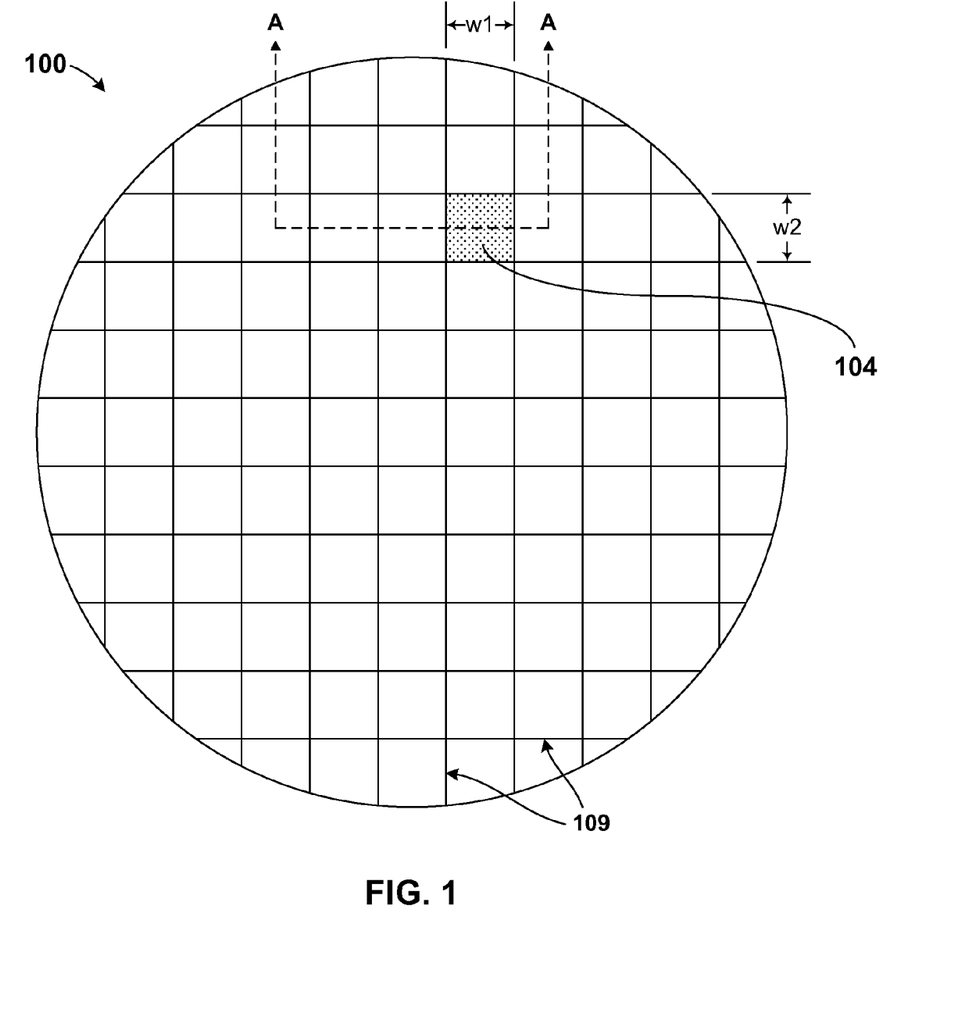
FIG. 1 is a top view of a wafer according to an exemplary embodiment.
Figure 2:
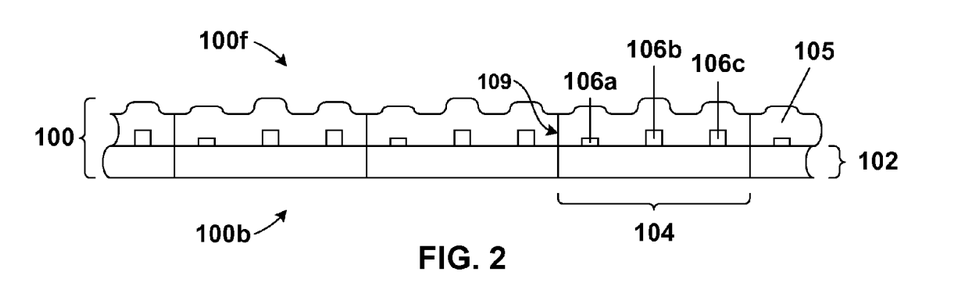
FIG. 2 is a cross section view of the wafer illustrated in FIG. 1 taken along section line A-A according to an exemplary embodiment.

FIGS. 1 and 2 are demonstrative illustrations of a wafer 100 during an intermediate step of fabrication. More specifically, the method may start with forming a semiconductor device 106a, 106b, and 106c on a substrate 102. FIG. 2 is a cross section view of the wafer 100 illustrated in FIG. 1 taken along cross section line A-A. It should be noted that FIG. 2 illustrates only a representative portion of the wafer 100.

The wafer 100 may contain a single die, a plurality of substantially similar dies, or a plurality of different dies. The wafer 100 may have a front side 100f and a back side 100b. The dies may be arranged in an array of rows and columns within the outer periphery of the wafer 100. A die 104 is illustrated by the shaded region in FIG. 1, having a width (w1) and a length (w2). The number of dies 104 within the wafer 100 may range from 10 to 1000. Among other factors, the actual number of dies 104 yielded from the wafer 100 is a function of the individual die 104 size, as well as the wafer 100 size. The dies 104 may also be referred to as a microelectronic chip, an integrated circuit chip, a chip, or any variation thereof. Each die 104 may include a single device 106a, 106b, and 106c or multiple devices 106a, 106b, and 106c. The devices 106a, 106b, and 106c may be, for example, a transistor or a resistor. A dicing channel, kerf, or scribe-line 109 is present between adjacent dies 104 in the array. The dicing channel, kerf, or scribe-line 109 may be free of devices 106a, 106b, and 106c or may contain test devices used for various purposes.

Now referring to the die 104 in FIG. 2. The substrate 102 may be any material known in the art. An inter-level dielectric layer 105 (hereinafter "ILD") may be formed on top of the devices 106a, 106b, and 106c and on top of the substrate 102. The ILD may be any material known in the art. Additional steps may be performed on the die 104, such as, for example, forming layers or etching material. Each step may create additional topographical variations on the die 104. The ILD 105 may cover the devices 106a, 106b, and 106c and any other layers created prior to the deposition of the ILD 105. This means that the ILD 105, after deposition, may possibly be characterized by a series of relatively uneven, nonplanar steps which may conform in height and width to the features of the underlying surface. This phenomenon is known as the "pattern factor effect."

Figure 3:
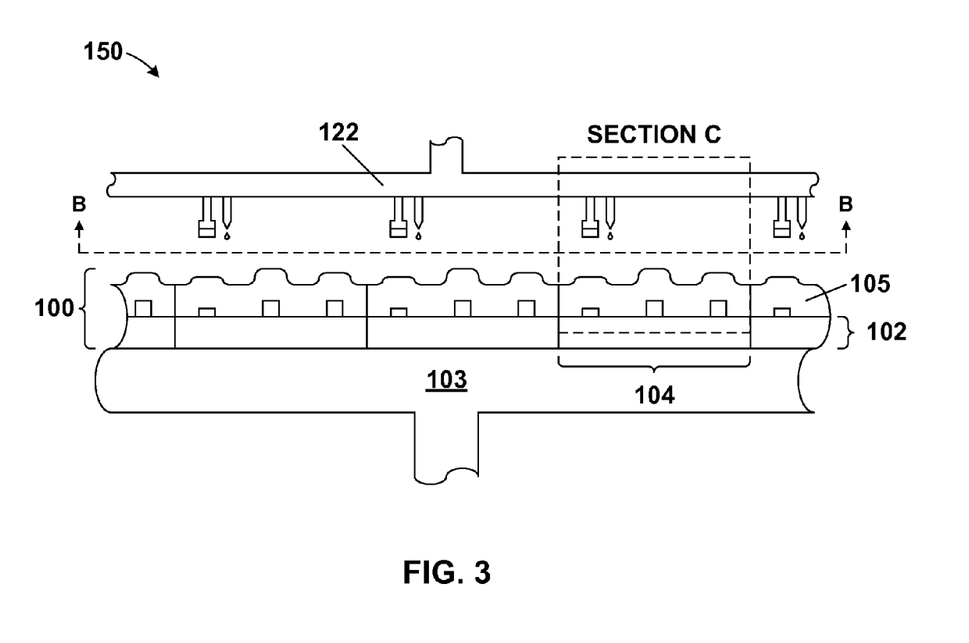
FIG. 3 is a cross section view of an apparatus according to an exemplary embodiment.
Figure 4:
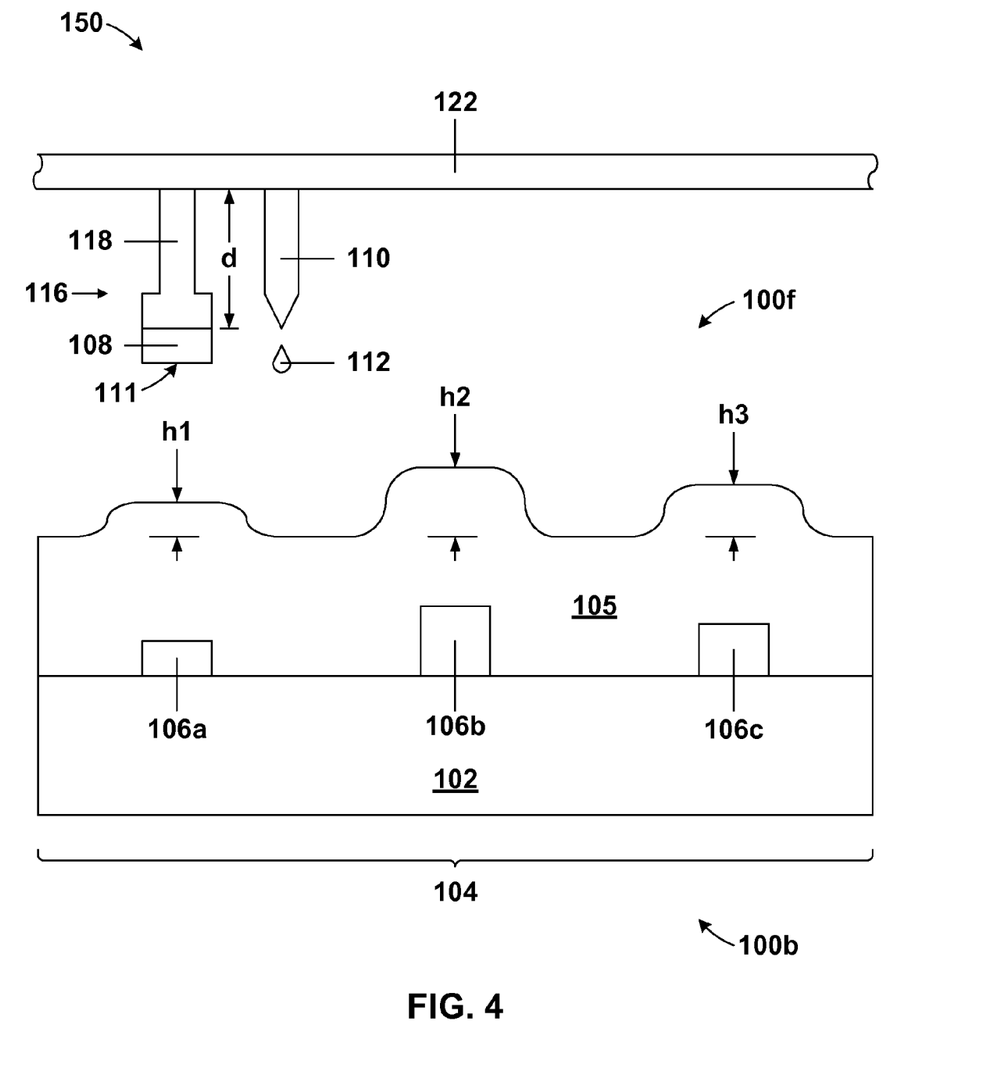
FIG. 4 is a section view of the apparatus illustrated in FIG. 3 depicting SECTION C according to an exemplary embodiment.
Figure 5:
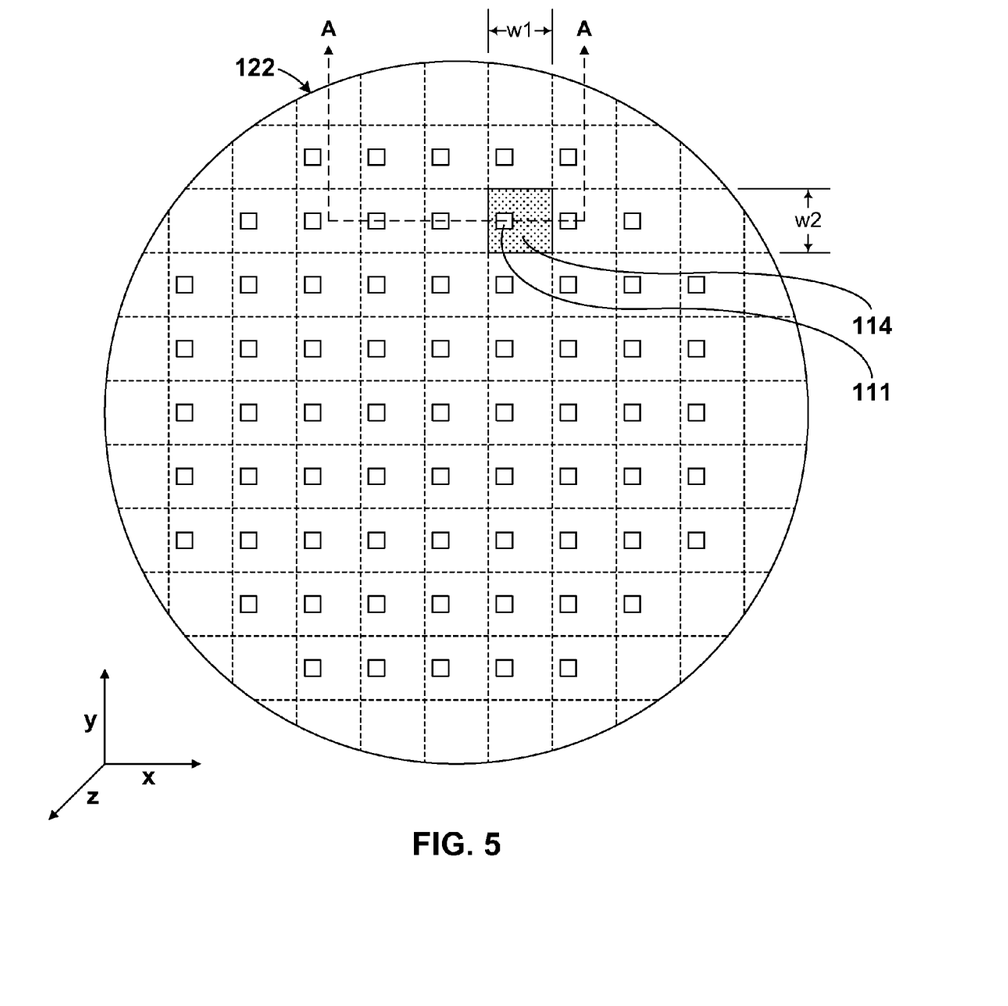
FIG. 5 is a cross section view of the apparatus taken along cross section line B-B.

FIGS. 3, 4, and 5 are demonstrative illustrations of an apparatus 150 during an intermediate step of a method of polishing the die 104 using a pad 108. More specifically, the method may include harnessing the wafer 100 to a wafer carrier 103. FIG. 4 depicts a section view of the apparatus 150 illustrated in FIG. 3 taken along SECTION C. FIG. 5 is a cross section view of the apparatus 150 taken along cross section line B-B of FIG. 3. It should be noted that FIGS. 3 and 4 illustrate only a representative portion of the apparatus 150.

The apparatus 150 may include the wafer carrier 103, a polishing carrier 122, a pad head 116, and a slurry delivery system 110. The back side 100b of the wafer 100 may be harnessed to the wafer carrier 103 and the front side 100f of the wafer 100 may be exposed. The pad head 116 and the slurry delivery system 110 may be coupled, together or independent of the other, to a bottom surface of the polishing carrier 122. The die 104 and the wafer carrier 103 may be below the polishing carrier 122, the pad head 116, and the slurry delivery system 110. The polishing carrier 122 may be any desired shape, such as, for example, a square, a rectangle, a triangle, or a circle. In an embodiment, the polishing carrier 122, as illustrated, may be a circle and may be roughly the same size as the wafer 100. The pad heads 116 may be capable of movement, adjustment, or fixed relative to the polishing carrier 122. The pad head 116 may be located above the die 104 and attached to the polishing carrier 122. In an embodiment, the pad head 116 may move anywhere within a die region 114, where the die region 114 may have a width (w1) and a length (w2) and the area of the die region 114 may be similar to the area within the perimeter of the die 104. The pad head 116 may include a pad 108 and a pad carrier 118. The pad 108 may be any desired shape, such as, for example, a square, rectangle, triangle or circle. In an embodiment, the pad 108 is illustrated as a square and one pad head 116 is located in each die region 114. It should be noted that any number of pad heads 116 may be formed in each die region 114 independent of the other die regions 114 and a fixed abrasive pad, where a polishing abrasive is fixed to the pad 108, may also be used. The pad 108 may be any material known in the art, such as, for example, compressible polyurethane foam. The pad 108 may have a polishing surface 111 and the polishing surface 111 may be above the die 104 and may be the bottom surface of the pad 108. The area of the polishing surface 111 may be smaller than a surface area of the die 104, where the surface area of the die 104 may be the exposed portion of the die 104 on the front side 100f of the wafer 100. The pad carrier 118 may be any shape, any material, and may be located above the pad 108. In an embodiment, the pad carrier 118 has a length (d).

The pattern factor effect, discussed above, may create a surface of the die 104 having varying topography. The topographical variation may be uniform from die to die but in some cases the variation may be different from die to die. The topographical variation is illustrated by a height h1, h2, and h3 and may correspond to the devices 106a, 106b, and 106c on the substrate below. Because of this topographical variation within the die 104 there may be some surfaces that need polishing while other surfaces may not need polishing or may need less polishing.

The polishing surface 111 may come in contact with the die 104 and may polish or remove material from the die 104 through any means, such as, for example, through rubbing, vibration, or varying pressure. The polishing surface 111 may be capable of polishing the die 104 by moving the polishing carrier 122 in an x-axis direction (lateral), y-axis direction (lateral), z-direction (vertical), rotation about any axis, or any other means. Polishing may also be accomplished by changing the length (d) of the pad carrier 118, by moving the pad head 116 relative to the die 104 or pad carrier 122 in an x-axis direction (lateral), y-axis direction (lateral), z-axis direction (vertical), rotation about any axis, or any other means. Polishing may also be accomplished by moving the die 104 relative to the polishing surface 111 in an x-axis direction (lateral), y-axis direction (lateral), z-axis direction (vertical), rotation about any axis, or any other means. It should be noted that material removed through polishing may be done to planarize the die 104 surface or to create a desired variation on the die 104 surface.

The slurry delivery system 110 may be capable of movement in the lateral or vertical direction, or fixed, relative to the polishing carrier 122 or relative to the die 104. Each slurry delivery system 110 may be corresponding to an individual pad head 116. The slurry delivery system 110 may deliver a slurry 112. The slurry 112 may be used during the polishing of the die 104. The slurry 112 may be targeted to the specific region of the die 104 being polished (as illustrated) or elsewhere. The slurry 112 can be delivered by droplet, spray, or any other means. The slurry may be, for example, a solution of alumina or silica and may be utilized as an abrasive medium. In an alternative embodiment, the slurry 112 may be applied from a slurry delivery system 110 within each pad head 116.

Figure 6:
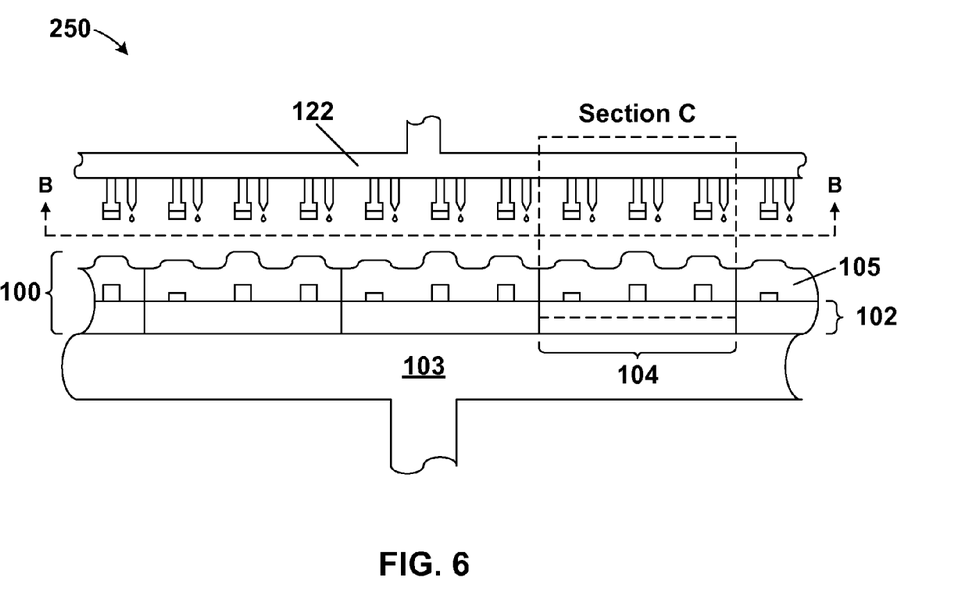
FIG. 6 is a cross section view of another apparatus according to an exemplary embodiment.
Figure 7:
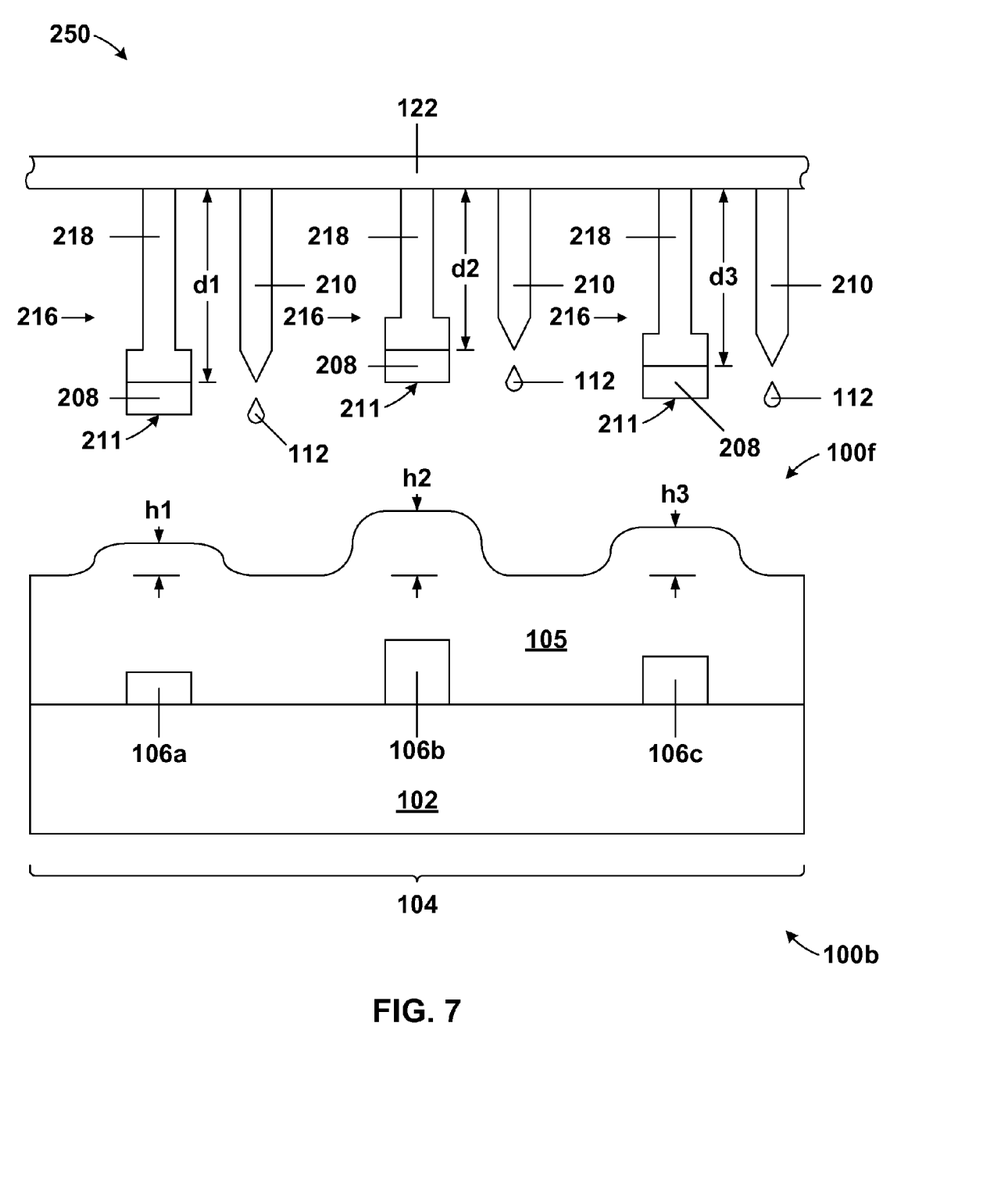
FIG. 7 is a section view of the apparatus illustrated in FIG. 6 depicting SECTION C according to an exemplary embodiment.
Figure 8:
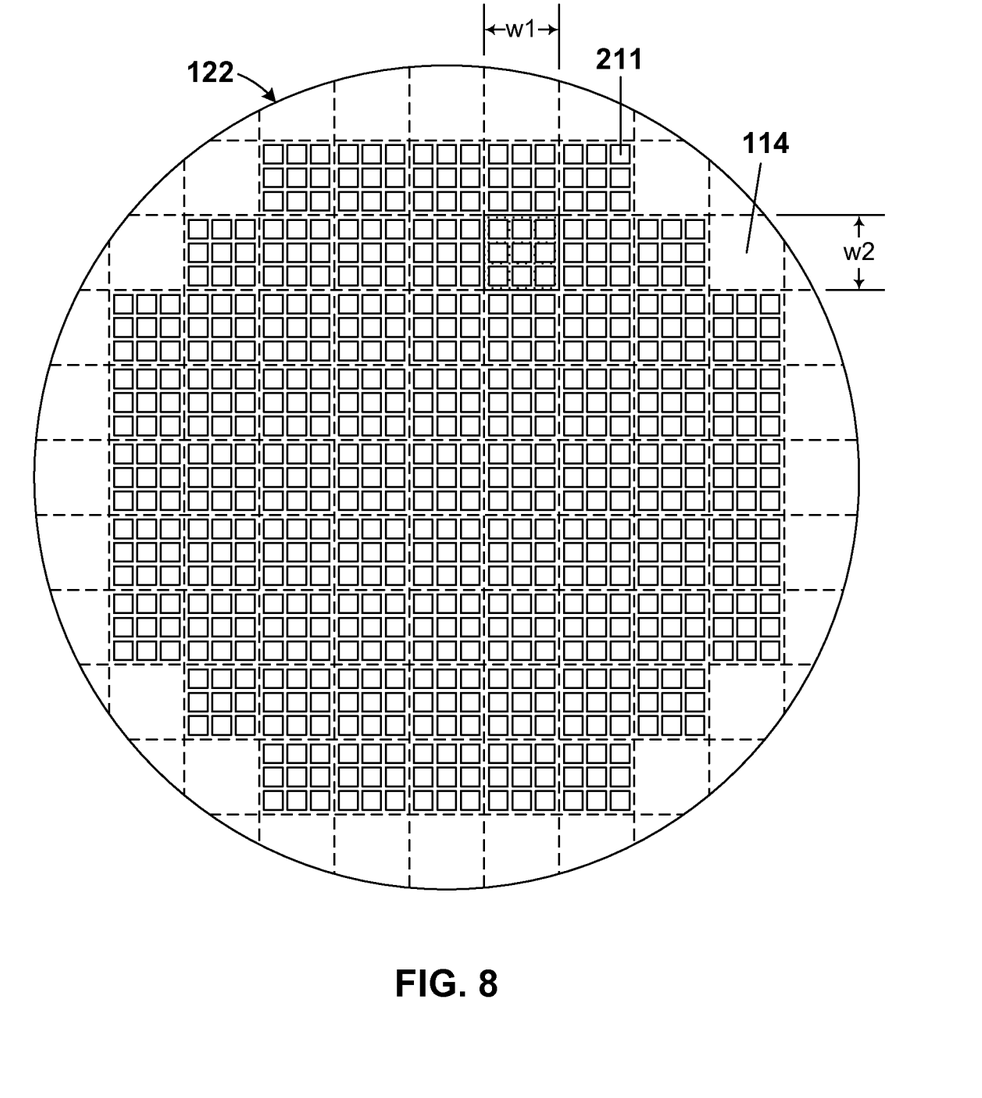
FIG. 8 is a cross section view of the apparatus illustrated in FIG. 6 taken along cross section line B-B.

FIGS. 6, 7, and 8 are demonstrative illustrations of an apparatus 250 according to an alternative embodiment. More specifically, the method may include placing the wafer 100 on the wafer carrier 103 and polishing the wafer 100 with a plurality of pad heads 216. FIG. 7 depicts a section view of the apparatus 250 illustrated in FIG. 6 taken along SECTION C. FIG. 8 is a cross section view of the apparatus 150 taken along cross section line B-B of FIG. 6. It should be noted that FIGS. 7 and 8 illustrate only a representative portion of the apparatus 250.

The apparatus 250 may include the wafer carrier 103, the polishing carrier 122, the plurality of pad heads 216, and a plurality of slurry delivery systems 210. The plurality of pad heads 216 and the plurality of slurry delivery systems 210 may be coupled together or independent of the other, and may be attached to the bottom surface of the polishing carrier 122 or independent of the polishing carrier 122, or a combination of both. The die 104 and wafer carrier 103 may be below the polishing carrier 122, the plurality of pad heads 216, and the plurality of slurry delivery systems 210. The polishing carrier 122 can be any desired shape, such as, for example, a square, a rectangle, a triangle, or a circle. In an embodiment, the polishing carrier 122 as illustrated may be a circle and may be roughly the same size as the wafer 100. The plurality of pad heads 216 may be capable of movement, adjustment, or fixed relative to the polishing carrier 122. The plurality of pad heads 216 may be located above the die 104. In an embodiment, the plurality of pad heads 216 are capable of movement anywhere within the die region 114. The plurality of pad heads 216 can move independent of, or in synchronization with, the other plurality of pad heads 216, or in a combination of both. The die region 114 may have a width (w1) and a length (w2) and the area of the die region 114 may be similar to the area of the die 104 within the perimeter of the die 104. The plurality of pad heads 216 may include a plurality of pads 208 and a plurality of pad carriers 218. The plurality of pads 208 may be any desired shape, such as, for example, a square, rectangle, triangle or circle. In an embodiment, the plurality of pads 208 are illustrated as squares and the die region 114 includes nine plurality of pad heads 216. It should be noted that each die region 114 may contain any number of plurality of pad heads 216 independent of the number of plurality of pad heads 216 in other die regions 114. The plurality of pads 208 may be any material known in the art, such as, for example, compressible polyurethane foam. The plurality of pads 208 may have a polishing surface 211 and the polishing surface 211 may be above the die 104. The area of a plurality of pad heads 216 polishing surface 211 may be smaller than the surface area of the die 104 where the surface area of the die 104 may be the exposed portion of the die 104 within the perimeter of the die 104. The plurality of pad carriers 218 may be any shape, any material, and may be located above the plurality of pads 208. The plurality of pad carriers 218 may have a length (d1, d2, and d3). Each plurality of pad carrier 218 may be a different length (d1, d2, and d3), the same length (d1, d2, and d3), or any variation thereof, from the other plurality of pad carriers 216.

The plurality of polishing surfaces 211 may come in contact with the die 104 and may polish or remove material from the die 104 through any means, such as, for example, through rubbing, vibration, or varying pressure. The plurality of polishing surface 211 may polish the die 104 by moving the polishing carrier 122 in an x-axis direction, y-axis direction, z-direction, rotation about any axis, or any variation thereof, or any other means. Polishing also may be accomplished by changing the length (d1, d2, or d3) of the pad carrier 118, by moving the plurality of pad heads 216 relative to the die 104 in an x-axis direction (lateral), y-axis direction (lateral), z-axis direction (vertical), rotation about any axis, or any other means. It should be noted that material removed through polishing may be done to planarize the die 104 surface or to create a desired variation.

The plurality of slurry delivery systems 210 may be movable, adjustable, or fixed, relative to the polishing carrier 122 or relative to the die 104. Each plurality of slurry delivery system 210 may be corresponding to a plurality of pad head 216. The plurality of slurry delivery systems 210 may deliver a slurry 112. The slurry 112 may be targeted to the specific region of the die 104 being polished (as illustrated) or elsewhere. The slurry 112 can be delivered by droplet, spray, or any other means. The slurry 112 may be a combination of oxidizing chemicals and an abrasive particle, such as, for example, alumina, silica, and ceria, suitable for the material being polished or the oxidizing chemicals devoid of the abrasive particles. In an alternative embodiment, the slurry 112 may be applied from the plurality of slurry delivery system 210 within each plurality of pad head 216.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    placing a wafer on a wafer carrier, wherein a front side of the wafer is exposed and a back side of the wafer is in contact with the wafer carrier, the wafer includes a die having a topographical variation and containing one or more semiconductor devices;
    polishing a portion of the die using a pad, the pad is smaller than the die, the pad is located above the front side of the wafer containing the die, wherein a bottom surface of the pad comes in contact with the front side of the die; and
    applying a slurry to the portion of the front side of the die being polished.

2. The method of claim 1, wherein polishing the portion of the die using the pad comprises:
    moving the pad relative to the die within a perimeter of the die.

3. The method of claim 1, wherein polishing the portion of the die using the pad comprises:
moving the die relative to the pad.

4. The method of claim 1, wherein polishing the portion of the die using the pad comprises:
applying varying pressure to portions of the die.

5. The method of claim 1, wherein polishing the portion of the die using the pad comprises:
using multiple pads, wherein the pads are organized to polish different dies.

6. The method of claim 1, wherein polishing the portion of the die using the pad comprises:
using multiple pads, wherein the pads are organized to polish a different portion of the die.

7. The method of claim 1, wherein polishing the portion of the die using the pad comprises:
using a multiple slurry delivery system, wherein each slurry delivery system applies the slurry to the portion of the die being polished.

8. A method comprising:
polishing a portion of a die using a pad, wherein the pad is located above the front side of a wafer containing the die, wherein the die has topographical variation and contains one or more semiconductor devices, the pad is smaller than the die and comes in contact with the front side of the die; and
applying a slurry to the portion of the die being polished, wherein the slurry is applied using a slurry delivery system.

9. The method of claim 8, wherein polishing the portion of the die using the pad comprises:
moving the pad relative to the die within a perimeter of the die.

10. The method of claim 8, wherein polishing the portion of the die using the pad comprises:
moving the die relative to the pad.

11. The method of claim 8, wherein polishing the portion of the die using the pad comprises:
applying varying pressure through the pad to the portion of the die being polished.

12. The method of claim 8, wherein polishing the portion of the die using the pad comprises:
using multiple pads, wherein the pads are organized to polish different dies.

13. The method of claim 8, wherein polishing the portion of the die using the pad comprises:
using multiple pads, wherein the pads are organized to polish different portions of the die.

14. The method of claim 8, wherein polishing the portion of the die using the pad comprises:
using a multiple slurry delivery system, wherein each slurry delivery system applies the slurry to the portion of the die being polished.

15. A method comprising:
placing a wafer on a wafer carrier, wherein a front side of the wafer is exposed and a back side of the wafer is in contact with the wafer carrier, the wafer includes a die;
polishing a portion of the die using a pad, the pad is smaller than the die, the pad is above the die, wherein a bottom surface of the pad comes in contact with the die; wherein polishing the portion of the die using the pad comprises using multiple pads organized to polish a different portion of the die; and
applying a slurry to the portion of the die being polished.

16. The method of claim 15, wherein polishing the portion of the die using the pad comprises:
moving the pad relative to the die within a perimeter of the die.

17. The method of claim 15, wherein polishing the portion of the die using the pad comprises:
moving the die relative to the pad.

18. The method of claim 15, wherein polishing the portion of the die using the pad comprises:
applying varying pressure to portions of the die.

19. The method of claim 15, wherein polishing the portion of the die using the pad comprises:
using a multiple slurry delivery system, wherein each slurry delivery system applies the slurry to the portion of the die being polished.

* * * * *